United States Patent [19]

Hollow

[11] Patent Number: 4,584,510

[45] Date of Patent: Apr. 22, 1986

[54] THUMB-ACTUATED TWO-AXIS CONTROLLER

[75] Inventor: Richard H. Hollow, Sunnyvale, Calif.

[73] Assignee: The United States of America as represented by the Administrator of the National Aeronautics and Space Administration, Washington, D.C.

[21] Appl. No.: 415,878

[22] Filed: Sep. 8, 1982

[51] Int. Cl.[4] .............................................. G05D 1/08
[52] U.S. Cl. .................................... 318/584; 318/640; 250/211 K; 200/157; 244/234
[58] Field of Search ................ 318/580, 583, 584–586, 318/593, 627, 640, 671; 250/211 K, 208, 221, 229, 231 R; 200/6 A, 157, 16 F, 153 K, 16 C, 15, 153 A; 244/234; 180/333

[56] References Cited

U.S. PATENT DOCUMENTS

| Re. 24,701 | 9/1959 | Redmond | 318/580 |
|---|---|---|---|
| 2,478,923 | 8/1949 | Imre | 200/157 |
| 3,198,922 | 8/1965 | Rohacs | 200/157 |
| 3,810,047 | 5/1974 | Shragal | 250/208 |
| 3,814,199 | 6/1974 | Jones | 250/229 X |
| 3,931,486 | 1/1976 | Raetz | 200/157 |
| 3,946,225 | 3/1976 | Beeck | 250/211 K X |
| 4,026,048 | 5/1977 | Hill | 200/16 C |
| 4,250,378 | 2/1981 | Mutton | 250/211 K X |
| 4,414,438 | 11/1983 | Maier | 200/157 X |
| 4,439,648 | 3/1984 | Reiner | 200/6 A |
| 4,445,541 | 5/1984 | Schmiel | 250/221 X |

*Primary Examiner*—William M. Shoop, Jr.
*Assistant Examiner*—Patrick C. Keane
*Attorney, Agent, or Firm*—Darrell G. Brekke; John R. Manning; Robert D. Marchant

[57] ABSTRACT

A two axis joystick controller (14) produces at least one output signal in relation to pivotal displacement of a member (32) with respect to an intersection of the two axes. The member (32) is pivotally movable on a support (42) with respect to the two axes. The support (42) has a centrally disposed aperture (46). A light source (34) is mounted on the pivotally movable member (32) above the aperture (46) to direct light (47) through the aperture. A light sensor (48) is mounted below the aperture (46) in the support (42) at the intersection of the two axes to receive the light (47) from the light source (34) directed through the aperture (46). The light sensor (48) produces at least one output signal related to a location on the sensor (48) at which the light (47) from the light source strikes the sensor (48). The two axis controller (14) is small enough in size to be mounted on another, hand-operated X-Y controller (10) for thumb operation by a hand positioned to operate the other X-Y controller (10). Knob (18) has a saddle shaped top (20) dimensioned to receive the thumb.

28 Claims, 5 Drawing Figures

THUMB-ACTUATED TWO-AXIS CONTROLLER

DESCRIPTION

Origin of the Invention

The invention described herein was made in the performance of work under a NASA contract and is subject to the provisions of Section 305 of the National Aeronautics and Space Act of 1958, Public Law 85-568 (72 Stat. 435; 42 U.S.C. 2457).

FIELD OF THE INVENTION

This invention relates to a two-axis joystick controller in which thumb motions actuate a movable button to produce two-axis control signals such as used in the piloting of an aircraft or spacecraft. More particularly, it relates to a displacement type controller incorporating an improved form of pivot assembly that has low friction and produces self-centering of the controller. It further relates to such a controller in which the button motions are accomplished in a manner suitable for use in a two level joystick controller system suitable for an aircraft or spacecraft environment.

DESCRIPTION OF THE PRIOR ART

It is known to employ joystick controllers in which output signals are produced dependent on the displacement of a joystick relative to two axes. Such joystick controllers typically employ gimbal or ball-and-socket arrangements for pivotal motion, which motion changes outputs from potentiometers attached to the joystick or in which an oscillator frequency is modulated by variable capacitance or inductive elements or strain gage elements are stressed and produce an output voltage, based on motion of the joystick.

As an alternative to such prior art joystick controllers, it has also been proposed to utilize light sensitive elements and a light source to provide output signals as a function of joystick position. Such light-actuated devices are disclosed in, for example, U.S. Pat. Nos. 3,811,047; 3,814,199 and 4,250,378.

In certain applications, it is desirable to have two levels of joystick control. For example, in a vertical take off and landing (VTOL) aircraft, it is advantageous to provide a conventional, floor mounted control stick for piloting the aircraft when it flies in a conventional manner. A second level of control is desirable for use when the aircraft is hovering. For this and similar applications, it would be desirable to have a thumb operated, miniature joystick controller that could be mounted on a conventional aircraft control stick, a throttle control lever grip, or a jet nozzle control grip.

The prior art joystick controllers are not suitable for such applications because they are all subject to one or more of the following major disadvantages: (1) they are too bulky for practical use in the restricted space of an aircraft control stick; (2) they have too much friction in their pivot points or socket, thus resulting in wear and lack of proper control; (3) at their centered position, the most critical joystick position, their output signal typically is low or even zero, giving an unfavorable signal-to-noise ratio; (4) they are not self-centering and the neutral or center position must therefore be found manually by the user; (5) they have an unsatisfactory breakout. Breakout is the term that describes the force required to move a joystick controller from its center or neutral position.

SUMMARY OF THE INVENTION

Accordingly, it is an object of this invention to provide a joystick controller small enough in size to fit into a conventional aircraft control stick yet providing comfort, sensitivity and precise positioning.

It is another object of the invention to provide a joystick controller with a self-centering feature to return the controller to a neutral position when it is not in use.

It is still another object of the invention to provide such a controller that has a desirable breakout and is not subject to inadvertent displacement from the center or zero position, even in the presence of external vibration.

It is a still further object of the invention to provide such a joystick controller having a high signal-to-noise ratio at all positions of the joystick, and especially at the centered position.

It is yet another object of the invention to provide an improved, low friction pivot assembly for a joystick controller.

The attainment of the foregoing and related objects may be achieved through use of the novel joystick controller, joystick controller combination and pivot assembly herein disclosed. The joystick controller of this invention produces at least one output signal in relation to pivotal displacement of a member with respect to an intersection of two axes. The member is pivotally movable on a support with respect to the two axes. The support has a centrally disposed aperture. A light sensor representing a two-axis coordinate system is mounted below the aperture and is adapted to receive a stationary or a swept light beam emanating from a light source mounted on the pivotally movable member, the light beam passing through the aperture. Finite output signals are generated representative of the position of the light beam with respect to the two axes, even when the beam is at the intersection of the two axes. Their magnitude always is sufficiently high to provide a substantial signal-to-noise ratio. The joystick controller has a biasing means for urging the pivotally movable member in contact with the support and in a position orthogonally disposed relative to the intersecting axes. When the pivotal member is off center, that is away from the intersection of the two axes, a very low friction single contact point is maintained between the member and its support. The configuration of the pivot member and its support provides the controller with a breakout that is very pleasing to users.

To provide a two-level joystick controller, a first joystick controller movable by a hand of a user provides a first level of two-axis control of an object. A second joystick controller is mounted on the first joystick. The second joystick controller is movable by a thumb of the user's hand while the hand is on the first joystick controller to provide a second level of two-axis control of an object. The second joystick controller is preferably of the type described immediately above. More generally, a two level control system may be provided by mounting a thumb actuated joystick controller on essentially any hand operated control means, such as a throttle control lever grip or a jet nozzle control grip.

The subject joystick controller is provided with a novel control button with a saddle shaped configuration that is adapted to receive the thumb of the operator. The button, which is one extremity of the pivot assembly, creates a comfortable tactile sensation. The thumb-actuated joystick is sensitive and enables precise two-axis positioning with minimum friction.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
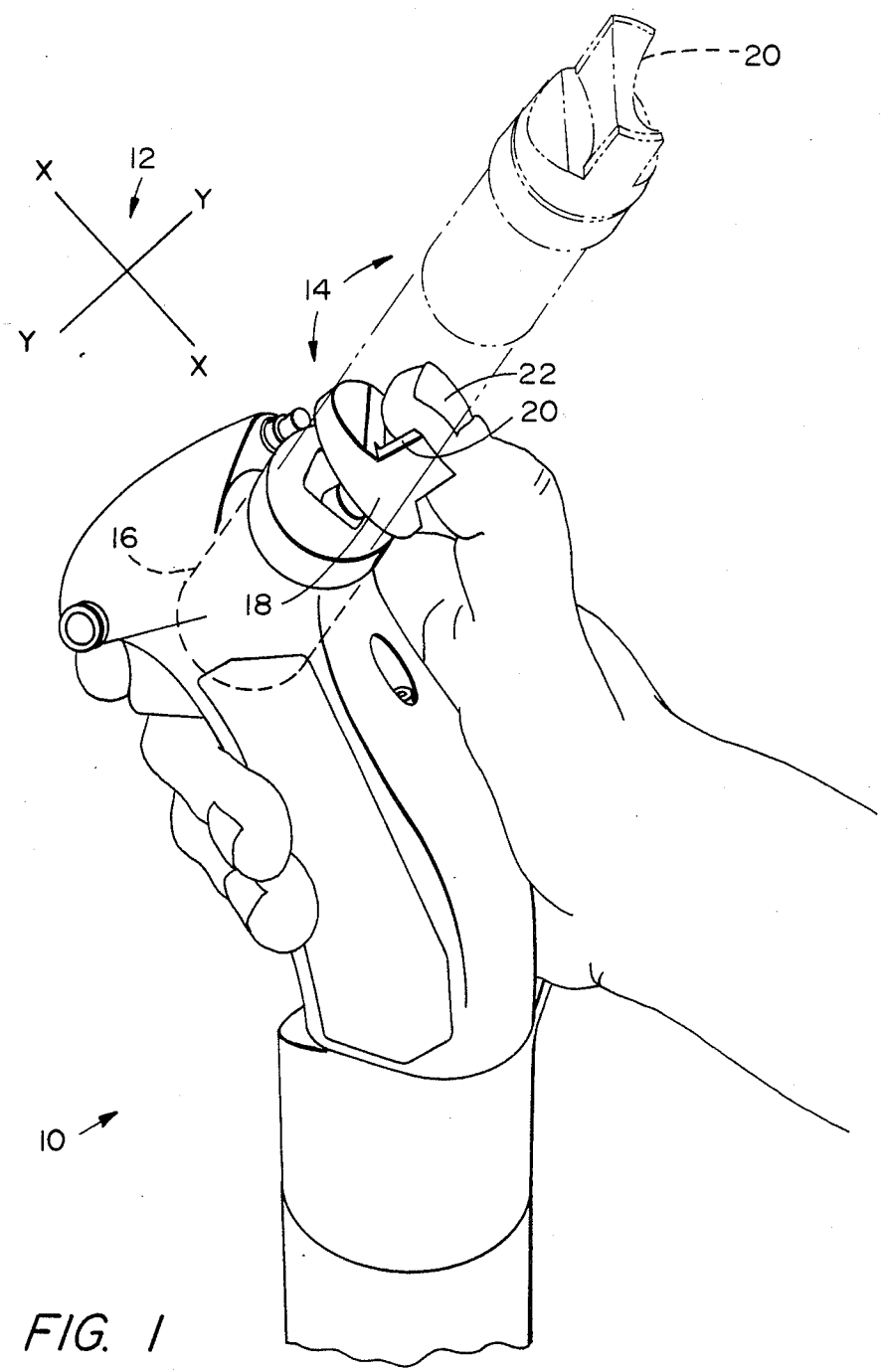
FIG. 1 is a perspective view of an aircraft control stick in combination with a joystick controller in accordance with the invention.

Turning now to the drawings, more particularly to FIG. 1, there is shown a B/8 type standard military aircraft control column grip 10, which is used to control a VTOL aircraft by hand movements in an X-Y axis 12. A miniaturized joystick controller 14 is mounted in receptacle 16 of the control grip 10. The miniature joystick controller 14 is operated by thumb movements in the X and Y direction on button 18. Button 18 has a saddle shaped top 20, curved to fit thumb 22.

Figure 2:
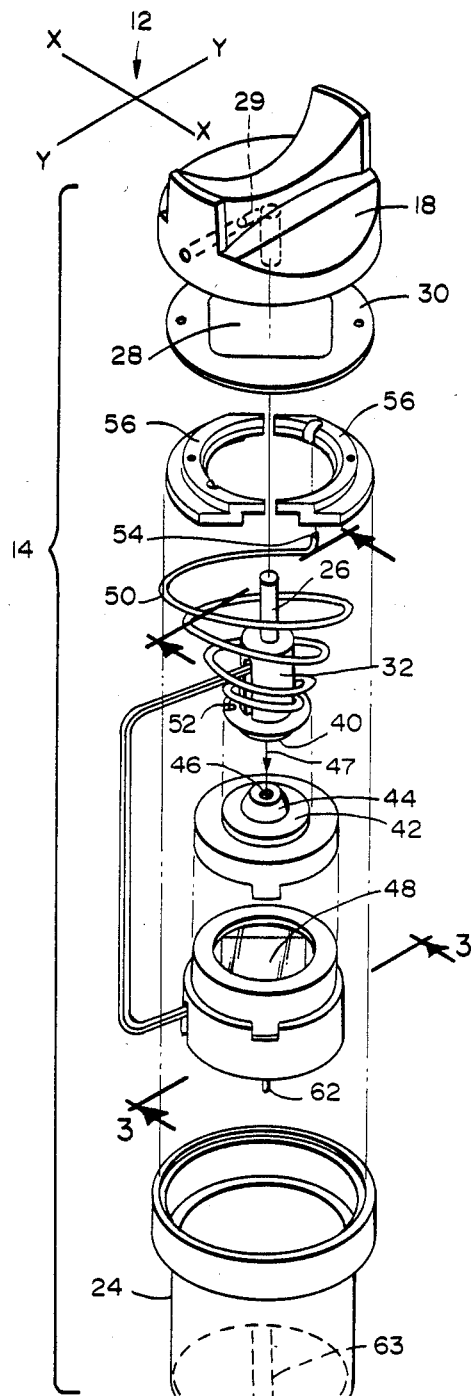
FIG. 2 is an exploded perspective view of the joystick controller in FIG. 1, showing details of its construction.

FIG. 2 shows details of the miniaturized joystick controller 14 shown in FIG. 1. Housing 24 fits into the receptacle 16 (FIG. 1) of the control grip 10. Shaft 26 of the joystick controller 14 extends through aperture 28 in cover 30. Aperture 28 is large enough to allow substantial motion of the shaft 26 in the X and Y directions from movement of the knob 18, mounted to shaft 26 by setscrew 29. Shaft 26 is fixedly attached to rocker member 32, which has a light emitting diode (LED) 34 mounted in its interior to direct light through collimating lens 36 (see FIG. 3). The rocker member 32 has a cylindrically shaped enclosure 38 below lens 36, which enclosure terminates in a circular knife edge 40. Knife edge 40 of the rocker member 32 rests on rocker plate 42, closely surrounding frusto-conical portion 44. The instant that rocker member 32 is tilted from the center position (from the axis orthogonal to the photodetector), the contact between the rocker member 32 and the rocker plate 42 is changed from a circular contact to a point contact and minimum friction is realized. Aperture 46 is centered in the frusto-conical portion 44 and extends through the rocker plate 42 to pass the collimated light 47 from LED 34 to dual axis photodetector 48. The diameter of the bundle of essentially parallel light rays from lens 36 is larger than the diameter of aperture 46.

Coil spring 50 has its end 52 fixedly attached to rocker member 32. End 54 of the spring is fixedly attached to split ring assembly 56, to anchor the end 54 of spring 50 to housing 24. The fastening of the ends of the spring in this manner helps prevent undue rotation of button 18. Pins 58 connect the photodetector 48 to amplifier package 60, which is in turn connected to external electronics by pins 62, which extend through slot 63 in housing 24.

Figure 3:
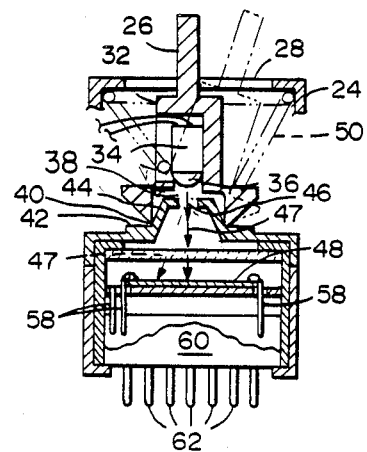
FIG. 3 is a cross-section view taken along the line 3—3 in FIG. 2.

The manner in which light from LED 34 moves on the surface of photodetector 48 when shaft 26 is moved in the X and Y directions is best shown in FIG. 3. Knife edge 40 of the rocker 32 pivots about the frusto-conical portion 44 of rocker plate 42 when the shaft 26 is moved. The combination of lateral and downward forces exerted by the coil spring 50 ensures that the pivot point of knife edge 40 remains against the base of frusto-conical portion 44. Coil spring 50 also assures that when button 18 is released, shaft 26 will be orthogonally centered with respect to the X-Y axes 12. Output signals of the photodetector 48 produced in response to light from LED 34 vary as the impinging position of the collimated light beam 47 changes. As shown in FIG. 3, the optical lever effect allows the light beam 47 to scan the surface of the photodetector 48. Even though the LED is off center from aperture 46 when rocker member 32 pivots, the light beam 47 impinging on the photodetector 48 always has a circular cross section, thus giving maximum precision to the controller.

In practice, the LED 34 may be implemented with a commercially available RCA SG-1009 type LED. The dual axis photodetector 48 may be implemented with a commercially available United Detector Corporation PIN-SC10/D photovoltaic type photodetector.

Figure 4:
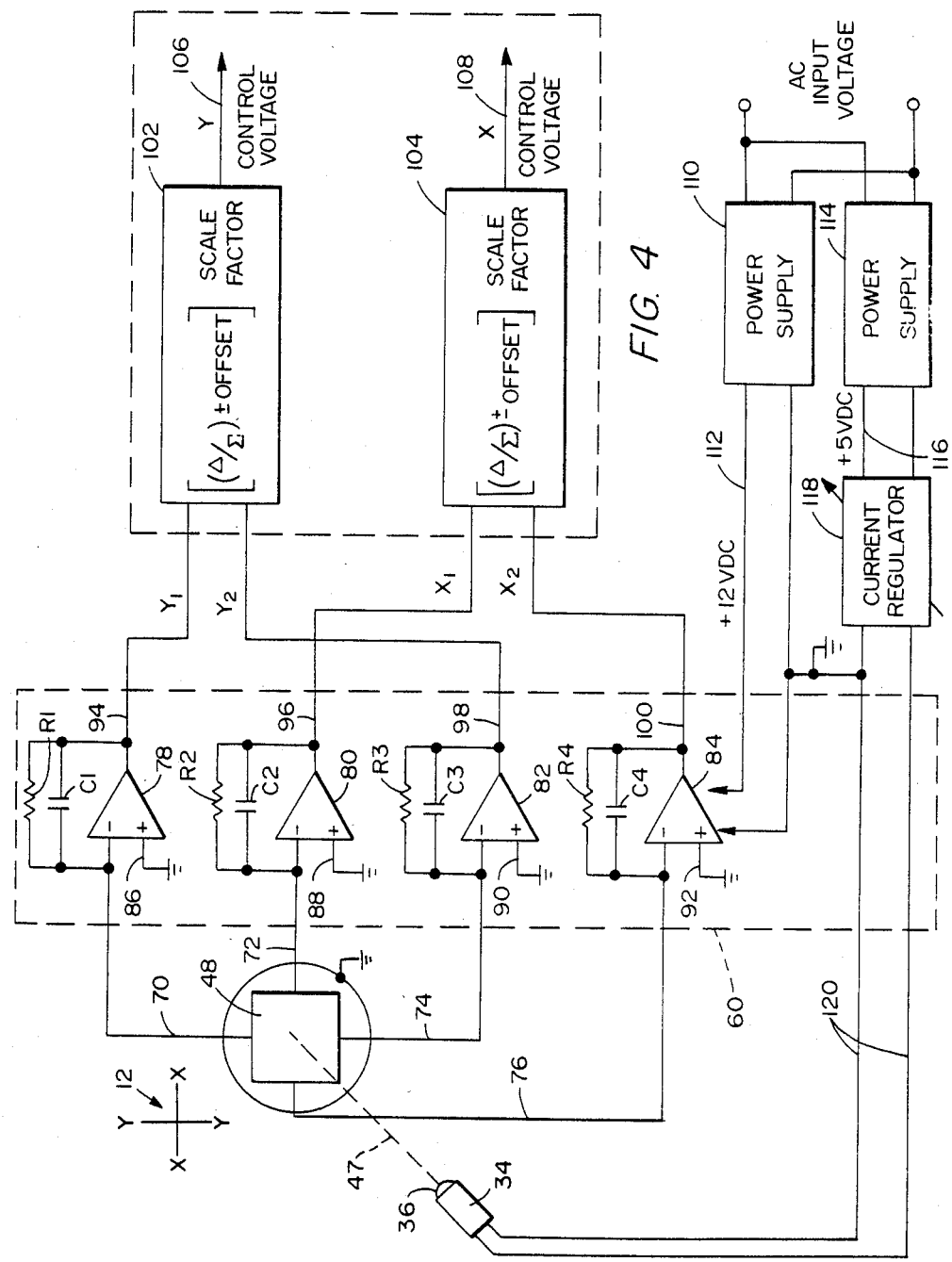
FIG. 4 is a block diagram of electronics for the joystick controller shown in FIGS. 1-3.

FIG. 4 shows the electronics for the X-Y controller of FIGS. 2 and 3 and is useful for further understanding of the operation of the controller 14. As shown, there is a connection from each side of the photodetector 48 by lines 70, 72, 74 and 76, respectively, to the inverting inputs of operational amplifiers 78, 80, 82 and 84. The non-inverting input to each of the operational amplifiers 78-84 is grounded by lines 86, 88, 90 and 92. Lines 94 and 98 respectively connect the outputs of operational amplifiers 78 and 82 to Y signal processing circuit 102. Lines 96 and 100 respectively connect the outputs of operational amplifiers 84 and 80 to the X signal processing circuit 104. The Y and X signal processing circuits 102 and 104 respectively divide the difference of the Y signals on lines 94 and 98 and the X signals on lines 96 and 100 by their respective sums to effect normalization, add or subtract any offset voltages and multiply the result by predetermined scale factors to give a Y axis control voltage on line 106 and an X axis control voltage on line 108. The signal processing (summing, subtracting, dividing and multiplying) may be performed by conventional analog or digital circuitry or computer programming. Feedback resistors R1–R4 and capacitors C1–C4 are connected between the output and the inverting input of each operational amplifier 78, 80, 82, 84 for current-to-voltage conversion and noise reduction respectively. The operational amplifiers may be implemented with a commercially available Texas Instruments TL-094 quad FET-input operational amplifier integrated circuit.

Power supply 110 converts an AC input voltage to a regulated +12 VDC. The DC voltage is conveyed to the V+ terminal of each operational amplifier 78, 80, 82, 84 by means of line 112. Power supply 114 converts the input voltage to a regulated +5 VDC on line 116. This regulated voltage is used by current regulator 118 which in turn provides the operating current for LED 34 via lines 120.

In operation, as light beam 47 impinges on the X-Y coordinate system on the surface of photodetector 48, a current will flow between each operational amplifier and the photodetector. When the light beam from the LED 34 strikes the center of the photodetector, all of the currents will be equal. When the light beam is off-center, the currents will vary depending on the location of the impingement. For example, if the light beam moves from the center position of the photodetector to a position on the X axis, the currents on lines 70 and 74 would be equal but the currents on lines 72 and 76 would differ by an amount representative of the beam displacement from the center. Likewise, if the light beam moved to a position on the Y axis, the currents on lines 72 and 76 would be equal and the currents on lines 70 and 74 would differ by an amount that is the function of the displacement of the light spot from the junction of the two axes. If the light beam was on the Y axis above the center of the photodetector (FIG. 4), the current on line 70 would be greater than the current on line 74 and the currents on lines 72 and 76 would be equal. It is thus seen that the four currents generated are a function of the location of the light spot on the photodetector. The currents on lines 70, 74, 72 and 76 are converted to voltage signals $Y_1$, $Y_2$, $X_1$, $X_2$, respectively, by operational amplifiers 78, 82, 80 and 84, respectively, and the voltage signals are normalized in circuits 102 and 104. The outputs of the operational amplifiers are always substantial and always of the same polarity for any position of the light beam. Therefore, the amplifiers each generate an identifiable finite signal voltage high above the noise voltage when the light beam is at the center of the photodetector or elsewhere on its surface.

After the normalization, as described above, has been performed in the signal processing circuits 102 and 104, any offset voltages found to be present with the rocker 32 self-centered may zeroed out by each signal processing circuit 102 and 104. The signal processing circuits 102 and 104 then scale each signal by a predetermined factor. The scale factor, for example, may be selected so that, when rocker 32 is at full deflection along any axis, the scaled output on line 106 or 108 equals 10 volts. A typical scale factor might be 15 times the normalized and offset corrected signal.

The magnitude of signals $Y_1$, $Y_2$, $X_1$, $X_2$ is a direct function of the intensity of light beam 47 and the intensity of the light beam is a function of the electric current supplied to LED 34. Current regulator 118 is employed to maintain the light output from LED 34 constant. The current regulator is adjusted so that currents 70, 74, 72, 76 will not overload amplifiers 78, 82, 80, 84. Typically, the current regulator is adjusted so that with rocker 32 at either full plus or minus deflection in the X axis or full plus or minus deflection in the Y axis neither $X_1$, $X_2$, $Y_1$, $Y_2$ exceeds 10 volts. Adjustment normally is made to set either $X_1$, $X_2$, $Y_1$, or $Y_2$ precisely to +10 volts. This adjustment is made after a five minute warmup for the system, and is then followed by determination of the offset voltages for processing circuits 102 and 104 and scale factor selection. Since the output voltages on lines 94–100 before normalization vary between +10 volts maximum and +2 volts minimum, and with typical magnitudes of $X_1$, $X_2$, $Y_1$, $Y_2$ of +5 volts each at the centered position, the low signal-to-noise ratio of centered prior art X-Y controllers is overcome. Common mode noise voltages are also substantially reduced by normalization in the signal processing circuits 102 and 104.

Figure 5:
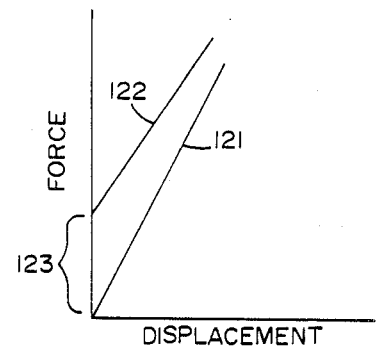
FIG. 5 is a force-displacement graph.

Breakout is the term used to describe the force needed to move a joystick controller from its center or neutral position. When a controller is utilized in an aircraft environment where the aircraft is constantly subject to vibrations and sudden unpredictable forces, it is extremely difficult, if not impossible, for a pilot to maintain a controller with zero breakout at its neutral position. Curve 121 in FIG. 5 shows the breakout plot of a typical prior art controller that employs a spring or springs to center the controller. As soon as a force is applied to such a controller, the controller is displaced. Such a controller essentially has zero breakout.

Imagine a large filled cylindrical oil drum resting on the concrete apron of a gasoline station with the longitudinal axis of the drum perpendicular to the concrete apron. If a one-year old child pushed on the side of the drum, the child would probably not succeed in lifting a portion of the base of the drum from the apron. Even though the child exerted a force on the drum, the force would be insufficient for the task and the drum would not move. A threshold force must be exceeded before the longitudinal axis of the drum can be tilted from its orthogonal relationship with the apron (and a portion of the base of the drum can be raised from the apron). Any force less than the threshold will fail to tilt the drum.

The base of rocker member 32 is planar and circular and the rocker member behaves like the oil drum mentioned above, that is, the rocker member cannot be tilted until a threshold force is exceeded on thumb button 18. This provides the controller with a welcome immunity to vibrations and other forces that do not exceed the threshold level. The breakout plot for a thumb actuated controller made in accordance with the subject invention is depicted as curve 122 in FIG. 5. The breakout is the segment represented by bracket 123 and superimposed on the ordinate.

It should now be apparent to those skilled in the art that a novel X-Y controller, two level X-Y controller system, and actuation button for a thumb operated X-Y controller capable of achieving the stated objects of the invention has been provided. The novel construction of the rocker and rocker plate in the X-Y controller of this invention permits a self-centered, low friction, light-actuated, miniature X-Y controller with desirable characteristics. The X-Y controller of this invention can be made small enough for integration within a larger hand operated X-Y controller to give a thumb operated second level X-Y controller that is human engineered for sensitivity, comfort and precision positioning. Some thumb actuated controllers conforming to the invention have been fabricated with body diameters of only 25.3 mm (0.995") and body-base to button-center heights of 43.2 mm (1.7").

It should further be apparent to those skilled in the art that various changes in form and details of the invention as shown and described may be made. It is intended that such changes be included within the spirit and scope of the claims appended hereto.

What is claimed is:

1. A two-axis controller which produces at least an output signal in relation to pivotal displacement of a member with respect to an intersection of the two axes, which comprises a support and a member pivotally movable on a support with respect to the two axes, said support comprising a plate portion surrounding an elevated portion having a centrally disposed aperture and said member being in pivotal contact with said plate portion, a light source mounted on said pivotally movable member above the aperture to direct light through the aperture at the intersection of the two axes to receive light from said light source directed through the aperture, a light sensor producing at least one output signal related to a location on said sensor at which the light from said light source strikes the sensor.

2. A two-axis controller which produces at least one output signal in relation to pivotal displacement of a member with respect to an intersection of the two axes, which comprises a support and a member resting and movable on the support with respect to the two axes, said support comprising a plate portion surrounding an elevated portion having a centrally disposed aperture, said member being in pivoted contact with said plate portion, a light source mounted on said pivotally movable member above the aperture to direct light through the aperture, and a light sensor mounted below the aperture at the intersection of the two axes to receive light from said light source directed through the aperture, the light sensor producing at least one output signal related to a location on said sensor at which the light from said light source strikes the sensor.

3. The two-axis controller of claim 2 additionally comprising a biasing means connected to said pivotally movable member for urging said pivotally movable member into a position orthogonally disposed relative to the intersecting axes.

4. The two-axis controller of claim 3 in which said biasing means is a coil spring concentrically surrounding said pivotally movable member having a first end fixedly connected to said pivotally movable member and a second fixedly mounted end.

5. The two-axis controller of claim 4 wherein said pivotally movable member includes an enclosure portion defining a circular knife edge, said support having a raised frusto-conical portion surrounded by a planar portion, the knife edge having a circumference closely fitting the base of the frusto-conical portion, said light source being located within the enclosure portion above the frusto-conical portion, and the pivotal movement of said pivotally movable member causing a rocking motion of said knife edge on said planar portion.

6. The two-axis controller of claim 5 in which said light source has a collimating lens positioned above the aperture to produce a collimated, circular cross section light beam and the aperture is circular cross shape, so that the light received on the light sensor is circular in shape for all positions of said pivotally movable member.

7. In combination, a first joystick controller movable by a hand of a user to provide a first level of two-axis control and a second joystick controller mounted on said first joystick controller, said second joystick controller being movable by a thumb of the user's hand while the hand is on said first joystick controller to provide a second level of two-axis control, said second joystick controller including a thumb-actuable button, a support comprising a plate portion surrounding an elevated portion with a centrally disposed aperture, a member resting and pivotally movable on said plate portion of said support with respect to said two axes of said second level, said axes intersecting one another orthogonally, said button being attached to one extremity of said member, a light beam source mounted on said pivotally movable member above the aperture to direct a light beam through the aperture, a light sensor mounted below the aperture at the intersection of the two second-level axes to receive said light beam directed through the aperture, the light sensor producing at least one output signal related to a location on said sensor at which the light from said light source strikes the sensor.

8. The combination of claim 7 in which said second joystick controller additionally comprises a biasing means connected to said pivotally movable member for urging said pivotally movable member into a position orthogonally disposed relative to the intersecting axes.

9. The combination of claim 8 in which said biasing means is a coil spring concentrically surrounding said pivotally movable member having a first end fixedly connected to said pivotally movable member and a second fixedly mounted end.

10. The combination of claim 10 wherein said pivotally movable member includes an enclosure portion defining a circular knife edge, said support having a raised frusto-conical portion surrounded by a planar portion, the knife edge having a circumference closely fitting the base of the frusto-conical portion, said light source being located within the enclosure portion above the frusto-conical portion, and the pivotal movement of said pivotally movable member causing a rocking motion of said knife edge on said planar surface.

11. In combination, a hand-actuable control means for providing a first level of control, and a joystick controller mounted on said control means, said joystick controller being movable by a thumb of a user's hand while the hand engages said control means, the thumb movement of the joystick controller providing a second level of control, said joystick controller including a rocker pivotal with respect to first and second orthogonal axes, a support comprising a plate portion surrounding on elevated portion having a centrally situated aperture, a button adapted to receive the thumb of the user, said rocker having first and second extremities, said button being attached to said first rocker extremity and said second rocker extremity resting and being pivotally movable on said plate portion of said support adjacent said aperture, means on said pivotally movable rocker for directing a light beam through said aperture, a light sensor mounted adjacent the aperture at the intersection of the two axes to receive the light beam passing through the aperture, and means coupled to said light sensor for producing signals representative of the location of the light beam with respect to the intersection of the axes.

12. The combination of claim 11 in which said joystick controller additionally comprises a biasing means connected to said pivotally movable rocker for urging said pivotally movable rocker into a position orthogonally disposed relative to the intersecting axes.

13. The combination of claim 12 in which said biasing means is a coil spring concentrically surrounding said pivotally movable rocker having a first end fixedly connected to said pivotally movable rocker and a second fixedly mounted end.

14. The combination of claim 13 wherein said pivotally movable rocker includes an enclosure portion defining a circular knife edge, said support having a raised frusto-conical portion surrounded by a planar portion, the knife edge having a circumference closely fitting the base of the frusto-conical portion, said light source being located within the enclosure portion above the frusto-conical portion, and the pivotal movement of said pivotally movable rocker causing a rocking motion of said knife edge on said planar surface.

15. A two-axis joystick controller having an improved breakout comprising a shaft movable with respect to orthogonal X and Y axes, said shaft having a first end and a second end, a finger-actuable button fixed to said first end, said second end terminating in a circular knife edge, a support plate for said shaft, said support plate having a planar portion surrounding a raised portion, said circular knife edge fitting closely around said raised portion while resting on said planar portion, and means for biasing said circular knife edge of said shaft against said planar portion of said support plate.

16. The two-axis controller of claim 15 additionally comprising a light source mounted in said shaft above the knife edge, in which the raised portion has an aperture through which a light beam from the light source may pass, and the joystick controller further comprises a photodetector positioned to receive the light beam through the aperture, said photodetector producing at least one output signal which is dependent on the position the light beam strikes said photodetector.

17. The joystick controller of claim 15 in which the raised portion is frusto-conical in shape.

18. The joystick controller of claim 15 in which said biasing means is a coil spring concentrically surrounding said shaft, having a first end fixedly connected to said shaft and a second fixedly mounted end.

19. A two-axis joystick controller requiring a step breakout force before displacement occurs comprising a rocker plate having a flat portion surrounding a tapered raised portion, a rocker having a longitudinal axis and first and second ends, said first end having user-actuable means for rocking said rocker with respect to first and second orthogonal axes, said second end of said rocker terminating in a circular knife edge that is contained in a plane normal to said longitudinal axis, said knife edge having a circumference closely fitting the base of said tapered raised portion, biasing means surrounding said rocker for urging said circular knife edge of said rocker against said flat portion of said rocker plate whereby said circular knife edge completely touches said rocker plate before said rocker is rocked and said knife edge only touches said rocker plate at a single contact point when said rocker is rocked on said rocker plate.

20. A joystick controller as set forth in claim 19 wherein said tapered raised portion is frusto-conical and has a centrally situated aperture.

21. A joystick controller as described in claim 20 further comprising means in said rocker for generating a light beam along said rocker longitudinal axis and through said aperture.

22. A joystick controller as in claim 21 wherein a two-axis photosensor is fixed adjacent said rocker plate and receives said light beam.

23. A joystick controller as in claim 22 further comprising means coupled to said photosensor for producing signals representative of the two-axis position of said light beam impinging on said photosensor.

24. The combination of claim 19 wherein said biasing means is a coil spring concentrically surrounding said rocker and said spring has a first end fixedly connected to said rocker and second fixedly mounted end.

25. A two-axis controller which produces at least one output signal in relation to pivotal displacement of a member with respect to an intersection of the two axes, which comprises the member pivotably movable on a support with respect to the two axes, a biasing means connected to said pivotally movable member for urging said pivotally movable member into a position orthogonally disposed relative to the intersection axes, said biasing means being a coil spring concentrically surrounding said pivotally movable member and having a first end fixedly connected to said pivotally movable member and a second fixedly mounted end, said support having a centrally disposed aperture, a light source mounted on said pivotally movable member above the aperture to direct light through the aperture, and a light sensor mounted below the aperture at the intersection of the two axes to receive light from said light source directed through the aperture, the light sensor producing at least one output signal related to a location on said sensor at which the light from said light source strikes the sensor, said pivotally movable member including an enclosure portion defining a circular knife edge, said support having a raised frusto-conical portion surrounded by a planar portion, the knife edge having a circumference closely fitting the base of the frusto-conical portion, said light source being located within the enclosure portion above the frusto-conical portion, and the pivotal movement of said pivotally movable member causing a rocking motion of said knife edge on said planar portion.

26. The two-axis controller of claim 25 in which said light source has a collimating lens positioned above the aperture to produce a collimated, circular cross-section light beam and the aperture is circular in shape, so that the light received on the light sensor is circular in shape for all positions of said pivotally movable member.

27. In combination, a first joystick controller movable by a hand of a user to provide a first level of two-axis control and a second joystick controller mounted on said first joy-stick controller, said second joystick controller being movable by a thumb of a user's hand while the hand is on said first joystick controller to provide a second level of two-axis control, said second joystick controller including a thumbactuable button, a support with a centrally disposed aperture, a member pivotally movable on said support with respect to said two-axes of said second level, said axes intersecting one another orthogonally, said button being attached to one extremity of said member, a light beam source mounted on said pivotally movable member above the aperture to direct a light beam through the aperture, a biasing means connected to said pivotally movable member for urging said pivotally movable member into a position orthogonally disposed relative to the intersecting axes, said biasing means being a coil spring concentrically surrounding said pivotally movable member and having a first end fixedly connected to said pivotally movable member and a second fixedly mounted end, said pivotally movable member including an enclosure portion defining a circular knife edge, said support having a raised frusto-conical portion surrounded by a planar portion, the knife edge having a circumference closely fitting the base of the frusto-conical portion, said light source being located within the enclosure portion above the frusto-conical portion, and the pivotal movement of said pivotally movable member causing a rocking motion of said knife edge on said planar surface, a light sensor mounted below the aperture at the intersection of the two second-level axes to receive said light beam directed through the aperture, the light sensor producing at least one output signal related to a location on said sensor at which the light from said light source strikes the sensor.

28. In combination, a hand-actuable control means for providing a first level of control, and a joystick controller mounted on said control means, said joystick controller being movable by a thumb of a user's hand while the hand engages said control means, the thumb movement of the joystick controller providing a second level of control, said joystick controller including a rocker, pivotal with respect to first and second orthogonal axes, a support having a centrally situated aperture, a button adapted to receive the thumb of the user, said rocker having first and second extremities, said button being attached to said first rocker extremity and said second rocker extremity being pivotally mounted on said support adjacent said aperture, a biasing means connected to said pivotally movable rocker for urging said pivotally movable rocker into a position orthogonally disposed relative to the intersecting axes, said biasing means being a coil spring concentrically surrounding said pivotally movable rocker and having a first end fixedly connected to said pivotally movable rocker and a second fixedly mounted end, said pivotally movable rocker including an enclosure portion defining a circular knife edge, said support having a raised frusto-conical portion surrounded by a planar portion, the knife edge having a circumference closely fitting the base of the frusto-conical portion, said light source being located within the enclosure portion above the frusto-conical portion, and the pivotal movement of said pivotally movable rocker causing a rocking motion of said knife edge on said planar surface, means on said said pivotally movable rocker for directing a light beam through said aperture, a light sensor mounted adjacent the aperture at the intersection of the two axes to receive the light beam passing through the aperture, and means coupled to said light sensor for producing signals representative of the location of the light beam with respect to the intersection of the axes.

* * * * *